(12) United States Patent
Cao

(10) Patent No.: US 11,804,412 B2
(45) Date of Patent: Oct. 31, 2023

(54) CIRCUIT FOR DETECTING CRACK DAMAGE OF A DIE, METHOD FOR DETECTING CRACK, AND MEMORY

(71) Applicant: CHANGXIN MEMORY TECHNOLOGIES, INC., Hefei (CN)

(72) Inventor: Lingling Cao, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 168 days.

(21) Appl. No.: 17/458,970

(22) Filed: Aug. 27, 2021

(65) Prior Publication Data

US 2022/0238399 A1 Jul. 28, 2022

Related U.S. Application Data

(63) Continuation of application No. PCT/CN2021/100011, filed on Jun. 15, 2021.

(30) Foreign Application Priority Data

Jan. 22, 2021 (CN) .......................... 202110087721.0

(51) Int. Cl.
*H01L 21/66* (2006.01)
*H01L 23/58* (2006.01)
(Continued)

(52) U.S. Cl.
CPC .......... *H01L 22/34* (2013.01); *G01R 31/2831* (2013.01); *H01L 23/562* (2013.01); *H01L 23/564* (2013.01); *H01L 23/585* (2013.01)

(58) Field of Classification Search
CPC ..... G01R 31/28; G01R 31/2831; H01L 21/66; H01L 23/00; H01L 23/58; H01L 22/34;
(Continued)

(56) References Cited

U.S. PATENT DOCUMENTS 8,159,254 B2 4/2012 Kaltalioglu
8,890,560 B2 11/2014 Kaltalioglu
(Continued)

FOREIGN PATENT DOCUMENTS

CN 101795132 A 8/2010
CN 204594486 A 8/2015
(Continued)

*Primary Examiner* — Jermele M Hollington
*Assistant Examiner* — Courtney G McDonnough
(74) *Attorney, Agent, or Firm* — Cooper Legal Group, LLC

(57) ABSTRACT

A circuit and method for detecting crack damage of a die are provided. The circuit comprises: a test circuit located within a seal ring of the die for outputting a pulse detection signal; a crack detection loop arranged outside a guard ring of an internal processing circuit of the die, having an input end connected to an output end of the test circuit and an output end connected to an output pin of the die; and a relay driving unit arranged between the input end and output end for increasing a capability of transmission of the pulse detection signal, wherein the seal ring surrounds the whole die; in a test mode, the test circuit outputs the pulse detection signal to the crack detection loop, and a test machine determines whether the die is damaged by a crack by reading a signal on the output pin of the die.

17 Claims, 4 Drawing Sheets

(51) Int. Cl.
*G01R 31/28* (2006.01)
*H01L 23/00* (2006.01)

(58) Field of Classification Search
CPC ... H01L 23/562; H01L 23/564; H01L 23/585; H01L 2924/3512
See application file for complete search history.

(56) References Cited

U.S. PATENT DOCUMENTS

| | | |
|---|---|---|
| 9,698,066 B2 | 7/2017 | Lee |
| 9,728,474 B1 * | 8/2017 | Yi ............................ H01L 22/34 |
| 11,105,846 B1 * | 8/2021 | Polomoff ........... G01R 31/2884 |
| 2009/0201043 A1 | 8/2009 | Kaltalioglu |
| 2012/0049884 A1 | 3/2012 | Kaltalioglu |
| 2013/0009663 A1 * | 1/2013 | Gauch ................... H01L 23/585 |
| | | 324/762.01 |
| 2015/0035556 A1 | 2/2015 | Kaltalioglu |
| 2017/0103929 A1 * | 4/2017 | Lee ....................... H01L 23/562 |
| 2020/0091021 A1 | 3/2020 | Lee et al. |

FOREIGN PATENT DOCUMENTS

| | | |
|---|---|---|
| CN | 107068637 A | 8/2017 |
| CN | 107636815 A | 1/2018 |
| CN | 110911386 A | 3/2020 |
| CN | 112908879 A | 6/2021 |

* cited by examiner

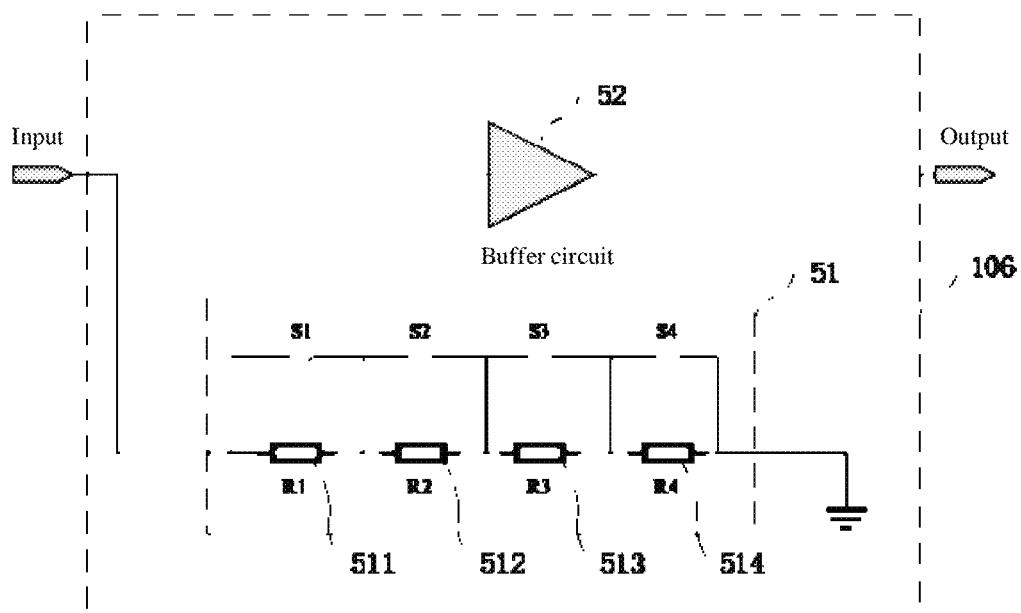

FIG. 5

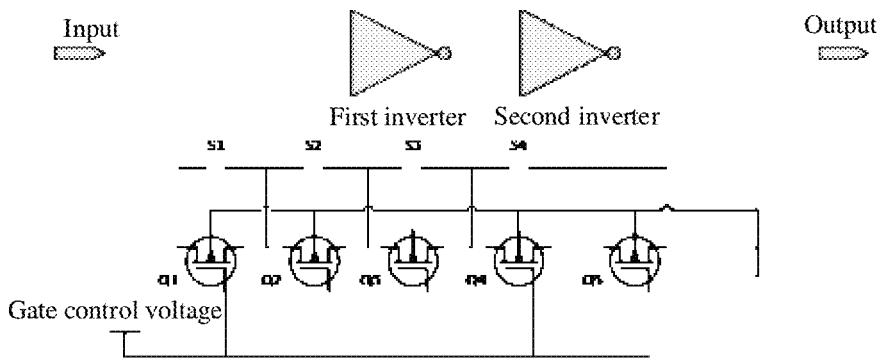

FIG. 6

| In response to a crack detection instruction, inputting a pulse detection signal to a crack detection loop of a circuit for detecting crack damage of a die through a test circuit of the circuit for detecting crack damage of the die according to the crack detection instruction | ~ S701 |
|---|---|

| Determining, according to a signal output feature of an output pin of a die to be tested and the pulse detection signal, whether there is crack damage in the die to be tested | ~ S702 |
|---|---|

FIG. 7

CIRCUIT FOR DETECTING CRACK DAMAGE OF A DIE, METHOD FOR DETECTING CRACK, AND MEMORY

CROSS-REFERENCE TO RELATED APPLICATIONS

The present application is a continuation of the International Patent Application No. PCT/CN2021/100011, filed on Jun. 15, 2021, which claims priority to China Patent Application No. 202110087721.0, filed on Jan. 22, 2021 in China National Intellectual Property Administration and entitled "CIRCUIT FOR DETECTING CRACK DAMAGE OF A DIE, METHOD FOR DETECTING CRACK, AND MEMORY". The disclosures of International Patent Application No. PCT/CN2021/100011 and China Patent Application No. 202110087721.0 hereby incorporated by reference in their entireties.

BACKGROUND

A semiconductor integrated chip is manufactured by simultaneously manufacturing dozens or even hundreds of integrated circuit units on one silicon wafer, then cutting the silicon wafer to get the integrated circuit units, thus forming dies, and testing, selecting and packaging the dies.

At present, there are two ways to cut the silicon wafer, i.e., blade sawing and laser cutting. However, no matter which method is used to realize cutting, it is inevitably that a crack is formed in the silicon wafer. When the crack spreads to the die, an integrated circuit inside may be destroyed, resulting in scrapped dies.

Therefore, it is necessary to add a circuit for detecting crack in a die to quickly identify a die with crack damage.

SUMMARY

The present disclosure relates to the technical field of semiconductors, in particular to, a circuit for detecting crack damage of a die, a method for detecting crack, and a memory.

In a first aspect, the present disclosure provides a circuit for detecting crack damage of a die, including: a test circuit located within a seal ring of the die and used to output a pulse detection signal; a crack detection loop arranged around the seal ring of the die, an input end of the crack detection loop being connected to an output end of the test circuit and an output end of the crack detection loop being connected to an output pin of the die; and a relay driving unit arranged between the input end and output end of the crack detection loop and used to increase a capability of transmission of the pulse detection signal.

In a second aspect, the present disclosure provides a circuit for detecting crack damage of a die, including: a test circuit located in a guard ring of an internal processing circuit of a die and used to output a pulse detection signal; a crack detection loop arranged between a seal ring of the die and the internal guard ring, an input end of the crack detection loop being connected to an output end of the test circuit and an output end of the crack detection loop being connected to an output pin of the die; and a relay driving unit arranged between the input end and output end of the crack detection loop and used to increase a capability of transmission of the pulse detection signal.

In a third aspect, the present disclosure provides a memory, including: a memory chip for storing data; wherein the memory chip includes a circuit for detecting crack damage of a die, the circuit comprises: a test circuit located within a seal ring of the die and used to output a pulse detection signal; a crack detection loop arranged outside a guard ring of an internal processing circuit of the die, an input end of the crack detection loop being connected to an output end of the test circuit and an output end of the crack detection loop being connected to an output pin of the die; and a relay driving unit arranged between the input end and output end of the crack detection loop and used to increase a capability of transmission of the pulse detection signal, wherein the seal ring surrounds the whole die and is used to protect the die; in a test mode, the test circuit outputs the pulse detection signal to the crack detection loop, and a test machine determines whether the die is damaged by a crack by reading a signal on the output pin of the die; the memory chip further comprises a data input/output pin, and the data input/output pin is used to connect peripheral equipment; when the memory is connected to a test machine through the data input/output pin, the memory enters a test mode, and the test machine determines whether the memory chip is damaged by a crack, by detecting an output signal on the data input/output pin.

BRIEF DESCRIPTION OF THE DRAWINGS

In order to describe the present disclosure or the technical solutions in the existing art more clearly, drawings required to be used in the illustration of the embodiments or existing art will be briefly introduced below. Apparently, the drawings in the illustration below are some embodiments of the present disclosure. Those ordinarily skilled in the art also can conceive other drawings according to the provided drawings without doing creative work.

FIG. 5 is a schematic structural diagram of a relay driving unit provided by the present disclosure;

FIG. 6 is a schematic structural diagram of another relay driving unit provided by the present disclosure; and FIG. 7 is a flowchart of a method for detecting crack provided by the present disclosure.

DETAILED DESCRIPTION

Figure 1:
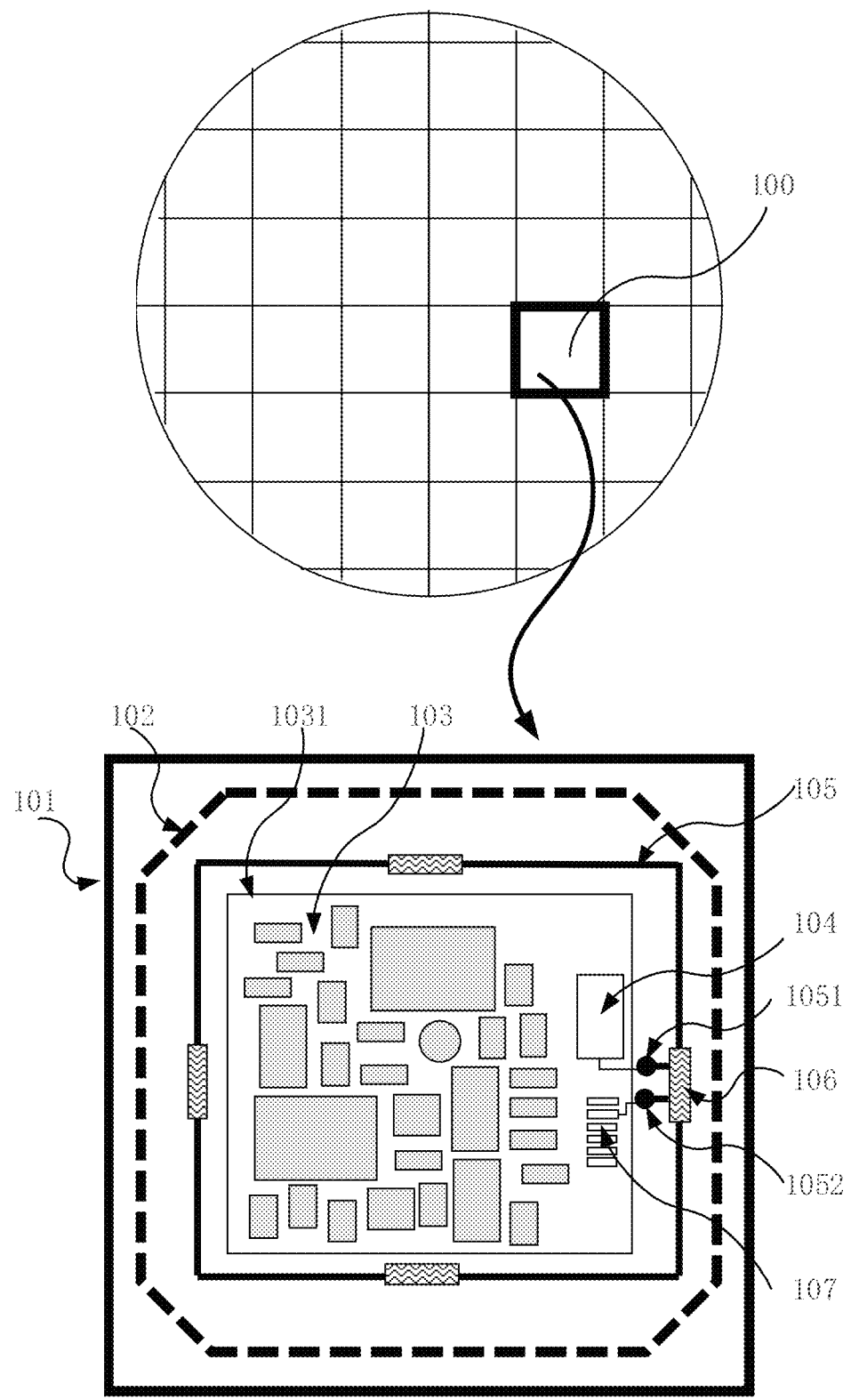
FIG. 1 is a schematic structural diagram of a first circuit for detecting crack damage of a die provided by the present disclosure.

In order to make the objectives, technical solutions and advantages of the embodiments of the present disclosure clearer, the technical solutions in the embodiments of the present disclosure will be described clearly and completely below in combination with the drawings in the embodiments of the present disclosure. Apparently, the embodiments described are part of the embodiments of the present disclosure, not all the embodiments. Based on the embodiments in the present disclosure, all other embodiments obtained by those of ordinary skill in the art without creative work, including but not limited to combinations of multiple embodiments, fall within the protection scope of the present disclosure.

The terms "first", "second", "third", "fourth", etc. (if any) in the description and claims of the embodiments of the present disclosure and the above-mentioned drawings are used to distinguish similar objects, and are not necessarily used to describe a specific sequence or a precedence order. It is to be understood that data used in this way is interchangeable under appropriate circumstances so that the embodiments of the present disclosure described herein can be implemented in an order other than those illustrated or described herein. In addition, the terms "include" and "have" as well as any of their variations are intended to cover non-exclusive inclusions. For example, processes, methods, systems, products, or devices that include a series of steps or units are not necessarily limited to those steps or units clearly listed below, but may include other steps or units that are not clearly listed or are inherent to these processes, methods, products, or devices.

Manufacturing of a semiconductor integrated chip generally includes five stages, i.e., preparation of a silicon wafer, manufacturing of an integrated circuit on silicon, silicon wafer cutting, testing and selection, and final packaging.

At present, there are two ways to cut the silicon wafer: blade sawing and laser cutting.

For the blade sawing, a grinding wheel blade made of tiny diamond particles is used to cut a silicon wafer at a high speed of 30,000 to 40,000 RPM. At the same time, a worktable carrying the silicon wafer linearly moves at a certain speed along a tangential direction between contact points of the blade and the silicon wafer. Silicon chips, i.e., dies, produced by wafer cutting are washed away with deionized water (pure water). The blade sawing has a characteristic of low cutting speed. If cuttings are thinner, cutting is more difficult. Furthermore, backside crack tends to be worse, and a top-layer metal layer of a die is easily damaged.

For the laser cutting, laser energy is concentrated in a very small region, a silicon wafer solid is sublimated at a high temperature within very short time, and volatilization is realized in a whole cutting process. The laser cutting has a characteristic of high cutting speed, and can also effectively alleviate a backside crack phenomenon of a thin sheet, i.e., a silicon wafer. Secondly, a width of a cut slot is small, so that loss of the cut slot is less than that of the blade sawing method, which can reduce a distance between respective dies. However, damages to each metal functional layer in the die by the laser cutting is unpredictable.

It can be seen that no matter which method is used to realize cutting, it is inevitably that a crack is formed in the silicon wafer. When the crack spreads to the die, an integrated circuit inside may be destroyed, resulting in that the die is scrapped.

In order to quickly identify a die damaged by a crack in the test selection stage, an inventive concept of the present disclosure is as follows.

A circle of crack detection loop is constructed around a die. The crack detection loop is disposed on a top-layer metal layer of a silicon wafer. Since both the blade sawing and the laser cutting are performed from top to bottom, cracks are most likely to occur at a top as well. If a detection signal is input from an input end of the crack detection loop and then is tried to be received from an output end, when the crack detection loop is damaged by crack intrusion due to stress during cutting, the output end will not receive the signal, or the received signal has changed and does not correspond to a preset standard output signal.

At the same time, the inventor of the present disclosure considered that since power of a general detection signal is relatively low, if detection is purely performed in the form of voltage or current, detection results will have errors. Furthermore, the detection is easily affected by an electromagnetic field in an environment, so that a detection sensitivity and speed are unsatisfactory. Therefore, the form of a pulse signal is used to replace voltage or current detection, and a relay driving unit is added to the crack detection loop, which can not only amplify the detection signal, but also improve a driving capability of transmission of the detection signal in the crack detection loop. The detection speed and efficiency are improved, the anti-interference ability is improved, false alarms are reduced.

A circuit for detecting crack damage of a die provided in the present disclosure will be introduced below in conjunction with the accompanying drawings.

FIG. 1 is a schematic structural diagram of a first circuit for detecting crack damage of a die provided by the present disclosure. As illustrated in FIG. 1, any die 100 on a silicon wafer is illustrated in an enlarged manner. The die 100 includes:

a cutting seam 101 which is a blade or laser cutting trajectory;

a seal ring 102 which is located outside an internal processing circuit 103, surrounds the whole die 100 and is used to protect the die 100, such as sucking sand, preventing electromagnetic interferences and preventing water vapor, wet air, etc.; and the internal processing circuit 103 which is an integrated circuit to realize main functions of the whole die and has an effective range within a guard ring 1031.

In the present embodiment, the circuit for detecting crack damage of a die includes:

a test circuit 104 located within the guard ring 1031 and used to output a pulse detection signal;

a crack detection loop 105 arranged between the seal ring 102 of the die 100 and the guard ring 1031 in an encircling manner, an input end 1051 of the crack detection loop being connected to an output end of the test circuit 104 and an output end 1052 of the crack detection loop being connected to an output pin 107 of the die 100; and a relay driving unit 106 arranged between the input end 1051 and the output end 1052 of the crack detection loop 105 and used to increase a capability of transmission of the pulse detection signal.

In a test mode, the test circuit 104 outputs the pulse detection signal to the crack detection loop 105, and a test machine determines, by means of reading a signal on the output pin 107 of the die 100, whether the die 100 is damaged by a crack.

It is to be noted that the number of the relay driving unit 106 is at least 1. When there are a plurality of relay driving units 106, the relay driving units may be uniformly distributed on the crack detection loop 105.

For example, when the crack detection loop 105 only contains a relay driving unit 106, the relay driving unit 106 is located on a midpoint between the input end 1051 and the output end 1052, that is, distances from the relay driving unit 106 to the input end 1051 and the output end 1052 are equal. When the crack detection loop 105 is rectangular, and the crack detection loop 105 contains four relay driving units 106, each relay driving unit 106 is located at a midpoint of each edge of the rectangle.

Figure 2:
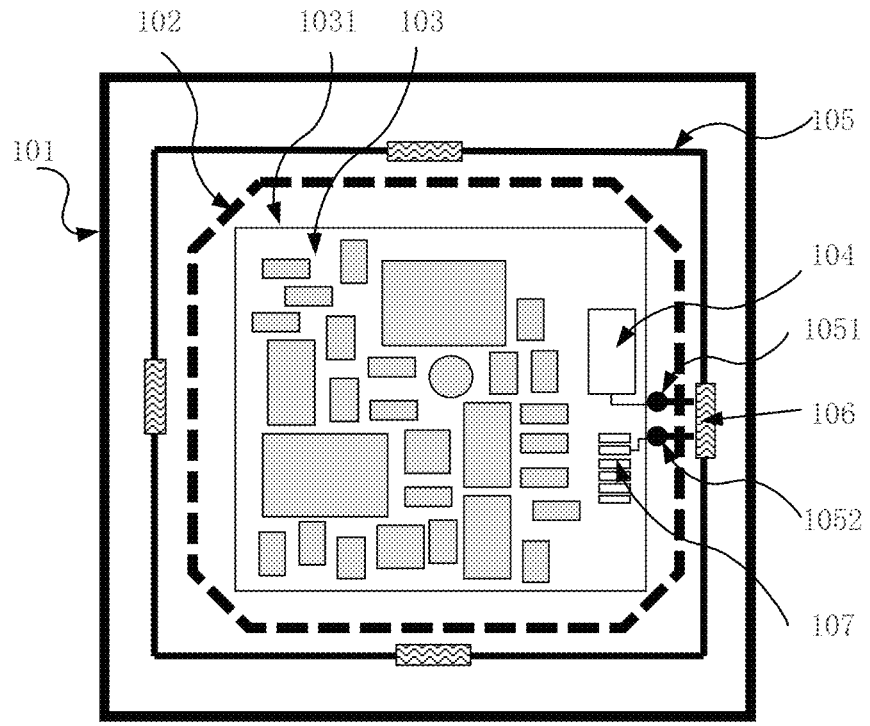
FIG. 2 is a schematic structural diagram of a second circuit for detecting crack damage of a die provided by the present disclosure.

In a possible design, the crack detection loop 105 may be also disposed outside the seal ring 102, as illustrated in FIG. 2.

The present disclosure provides a circuit for detecting crack damage of a die, a method for detecting crack, and a memory. The circuit for detecting crack damage of a die includes a test circuit, a crack detection loop, and a relay driving unit. The test circuit is located within a seal ring of the die and used to output a pulse detection signal; a crack detection loop located inside and/or outside the seal ring, an input end of the crack detection loop being connected to an output end of the test circuit and an output end of the crack detection loop being connected to an output pin of the die; and a relay driving unit arranged between the input end and output end of the crack detection loop and used to increase a capability of transmission of the pulse detection signal. The seal ring surrounds the whole die and is used to protect the die. In a test mode, the test circuit outputs the pulse detection signal to the crack detection loop, and a test machine determines whether the die is damaged by a crack by reading a signal on the output pin of the die. The relay driving unit performs amplified driving on the pulse detection signal in the crack detection loop of located on the top-layer metal layer, so that a speed and sensitivity of crack detection are greatly improved. The test machine directly reads the output pin of the die to quickly obtain a detection result, and test convenience of the test machine is improved.

FIG. 2 is a schematic structural diagram of a second circuit for detecting crack damage of a die provided by the present disclosure. As illustrated in FIG. 2, the circuit for detecting crack damage of a die includes:

a test circuit 104 located in a seal ring 102 and used to output a pulse detection signal;

a crack detection loop 105 arranged outside the seal ring 102 in an encircling manner, an input end 1051 of the crack detection loop being connected to an output end of the test circuit 104 and an output end 1052 of the crack detection loop being connected to an output pin 107 of a die 100; and a relay driving unit 106 arranged between the input end 1051 and the output end 1052 of the crack detection loop 105 and used to increase a capability of transmission of the pulse detection signal.

The seal ring 102 surrounds the whole die 100 and is used to protect the die 100, such as sucking sand, preventing electromagnetic interferences and preventing water vapor, wet air, etc.

In a test mode, the test circuit 104 outputs the pulse detection signal to the crack detection loop 105, and a test machine determines, by means of reading a signal on the output pin 107 of the die 100, whether the die 100 is damaged by a crack.

Figure 3:
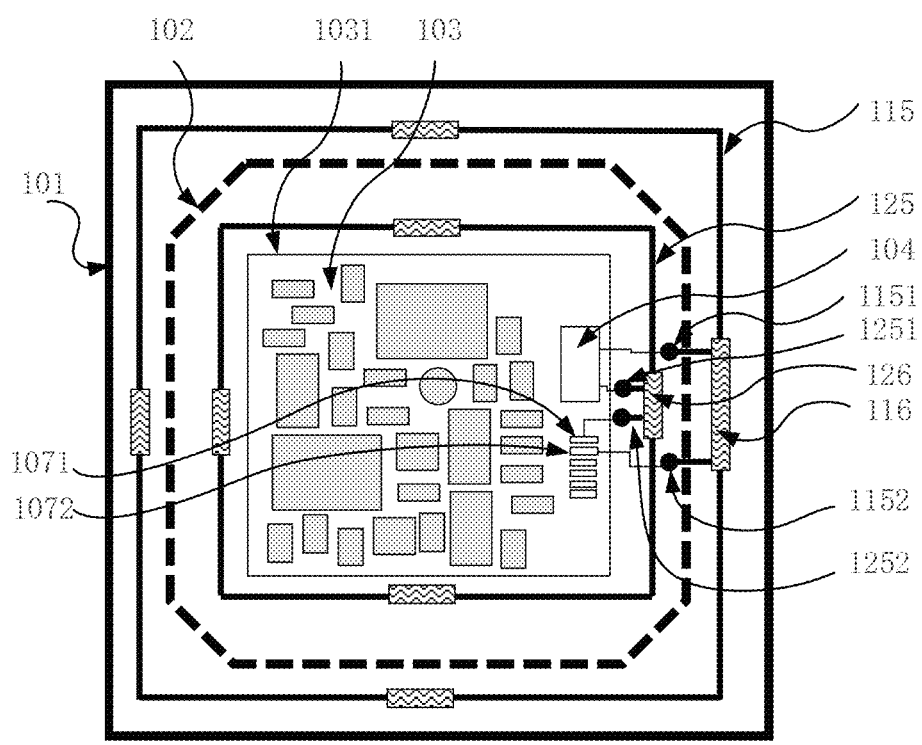
FIG. 3 is a schematic structural diagram of a third circuit for detecting crack damage of a die provided by the present disclosure.

In another possible design, the crack detection loop 105 may be also two loops simultaneously disposed inside and outside the seal ring 102, as illustrated in FIG. 3.

FIG. 3 is a schematic structural diagram of a third circuit for detecting crack damage of a die provided by the present disclosure. As illustrated in FIG. 3, the circuit for detecting crack damage of a die includes:

a test circuit 104 located in a guard ring 1031 of an internal processing circuit 103 of a die 100 and used to output a pulse detection signal through a first output end and/or a second output end;

a first crack detection loop 115 arranged outside the seal ring 102 in an encircling manner, an input end 1151 of the first crack detection loop being connected to a first output end of the test circuit 104 and an output end 1152 of the first crack detection loop being connected to a first output pin 1071 of the die 100;

a second crack detection loop 125 arranged between the seal ring 102 and the internal guard ring 1031, an input end 1251 of the second crack detection loop being connected to a second output end of the test circuit and an output end 1252 of the second crack detection loop being connected to a second output pin 1072 of the die 100;

a first relay driving unit 116 arranged between the input end 1151 and the output end 1152 of the first crack detection loop 115 and used to increase a capability of transmission of the pulse detection signal; and a second relay driving unit 126 arranged between the input end 1251 and the output end 1252 of the second crack detection loop 125 and used to increase the capability of transmission of the pulse detection signal.

The seal ring 102 surrounds the whole die 100 and is used to protect the die 100, such as sucking sand, preventing electromagnetic interferences and preventing water vapor, wet air, etc.

In a test mode, the test circuit 104 outputs the pulse detection signal to the first crack detection loop 115 and/or the second crack detection loop 125, and a test machine determines, by means of reading a signal on the output pin 1071 of the die 100 or the second output pin 1072 of the die 100, whether the die is damaged by a crack.

The present embodiment provides a circuit for detecting crack damage of a die which includes a test circuit, a crack detection loop, and a relay driving unit. The test circuit is located within a seal ring of the die and used to output a pulse detection signal; a crack detection loop located inside and/or outside the seal ring, an input end of the crack detection loop being connected to an output end of the test circuit and an output end of the crack detection loop being connected to an output pin of the die; and a relay driving unit arranged between the input end and output end of the crack detection loop and used to increase a capability of transmission of the pulse detection signal. The seal ring surrounds the whole die and is used to protect the die. In a test mode, the test circuit outputs the pulse detection signal to the crack detection loop, and a test machine determines whether the die is damaged by a crack by reading a signal on the output pin of the die. The relay driving unit performs amplified driving on the pulse detection signal in the crack detection loop of located on the top-layer metal layer, so that a speed and sensitivity of crack detection are greatly improved. The test machine directly reads the output pin of the die to quickly obtain a detection result, and test convenience of the test machine is improved.

It is to be noted that in a possible design, the signal output by the output end of the crack detection loop firstly returns to the internal circuit of the die, then is converted by the internal circuit, and is output to the output pin of the die. The test machine detects the signal of the output pin.

It is to be noted that in a possible implementation, the crack detection loop is arranged on a top-layer metal layer of a silicon wafer substrate where the die 100 is.

Figure 4:
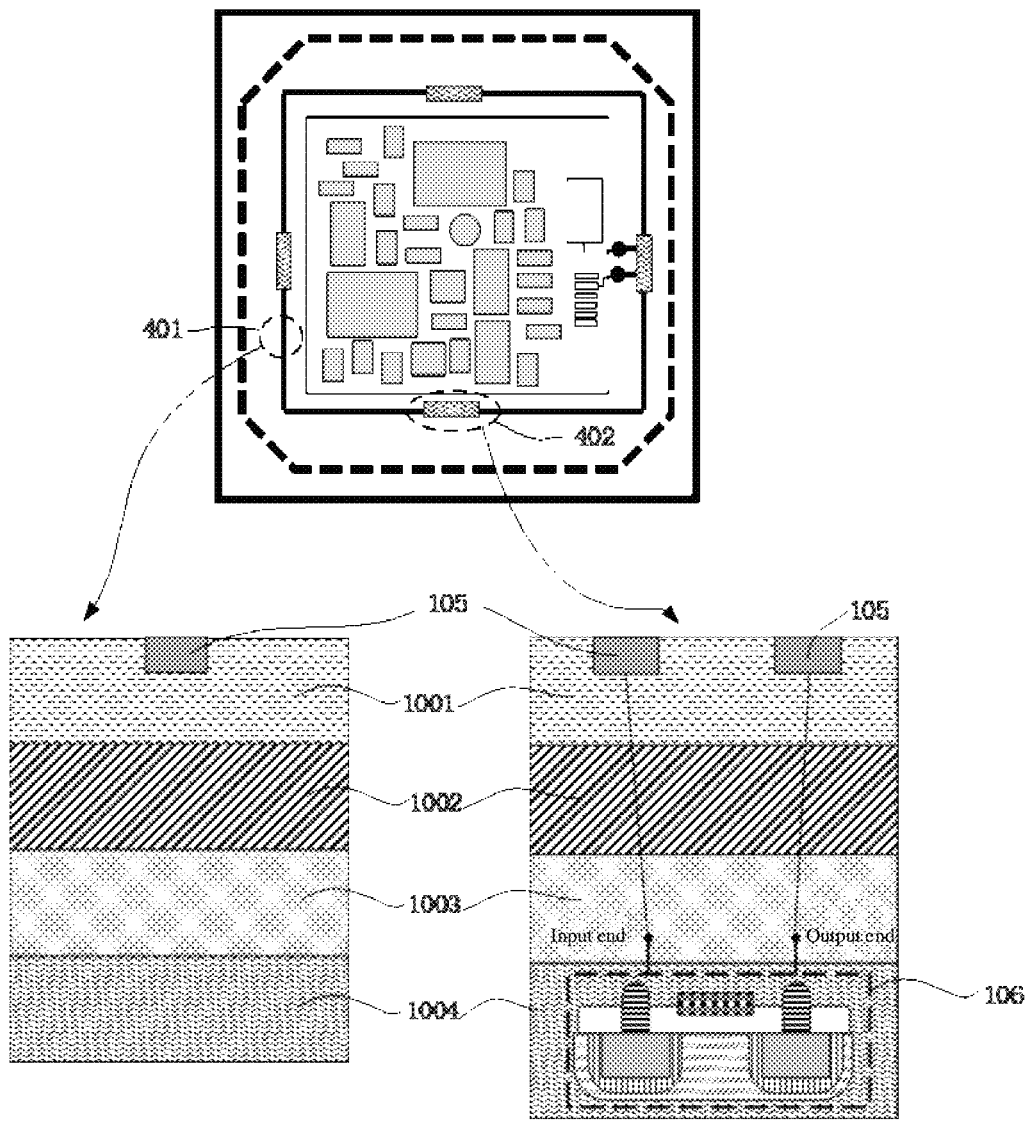
FIG. 4 is a sectional structural diagram of a crack detection loop provided by the present disclosure at different positions.

FIG. 4 is a sectional structural diagram of a crack detection loop provided by the present disclosure at different positions. As illustrated in FIG. 4, a cross section 401 is a cross-sectional view where the crack detection loop 105 is not connected to other circuits. A substrate of the die 100 can be regarded as being composed of a plurality of metal layers including: a first metal layer 1001 (including a top-layer metal layer and an insulation layer between the top-layer metal layer and a sub-top-layer metal layer), a second metal layer 1002 (a top-layer metal is recorded as a first-layer metal layer, and the following is a second-layer metal layer, a third-layer metal layer and a fourth-layer metal layer; the second metal layer 1002 here includes the second-layer metal layer and an insulation layer between the second-layer metal layer and the third-layer metal layer), and a third metal layer 1003 (the third metal layer 1003 here includes a third-layer metal layer and an insulation layer below the third-layer metal layer). The inventor of the present disclosure has found in long-term practice that the top-layer metal layer is the most vulnerable to a crack damage. When other metal layers are damaged by cracks, the top-layer metal layer will also be damaged by a crack generally. Therefore, disposing a detection line of the crack detection loop 105 on the top-layer metal layer can effectively detect the crack damage. In addition, a layout space can also be reserved for other circuits. For example, other circuit elements or routes can be arranged on the second metal layer 1002 and the third metal layer 1003 in FIG. 4.

A cross section 402 is a schematic diagram of connection between the relay driving unit 106 connected in series to the crack detection loop 105 and a detection line of the crack detection loop 105. The input end and output end of the relay driving unit 106 are respectively connected to the crack detection loop 105. A connection method may be passing through via holes of a plurality of metal layers.

For better understanding, the relay driving unit 106 is described in detail below.

The nature of the relay driving unit 106 is to amplify the pulse detection signal to improve driving capability of the pulse detection signal. A voltage of the pulse detection signal is usually only 0 to 1.2 V, and a current is very small. This causes that the driving capability of the pulse detection signal in the crack detection loop 105 is low, which increases detection time of the die 100. Therefore, the pulse detection signal needs to be amplified to a certain extent. This is the function of the relay driving unit 106.

In a possible implementation, the relay driving unit 106 includes: a buffer circuit, i.e., a buffer. The buffer circuit is used to enhance the pulse detection signal and drive the pulse detection signal to be transmitted to the output end of the crack detection loop. A load capacitance of the circuit is reduced by the buffer. After the load capacitance is reduced, a capacitance charging speed is high (a rising edge is steep) under the same voltage. Similarly, stored capacitance is low in case of low capacitance, and time for discharge is short (a falling edge is steep). In a word, the buffer reduces the load capacitance of the circuit, thereby improving the driving capability of the circuit. There are also many methods to realize the buffer circuit, and those skilled in the art can select one of buffer amplifiers to implement the buffer circuit according to actual needs.

In a possible implementation, the buffer circuit includes an inverter. An implementation of the inverter includes an integrated Schmitt trigger unit, or is directly formed by cascading an N-channel Metal Oxide Semiconductor (NMOS) and a P-channel Metal Oxide Semiconductor (PMOS). Since an inverter will cause a phase of a signal to be inverted, inverters are generally used in pairs to form the buffer, that is, a buffer circuit has 2n (n is an integer greater than or equal to 1) inverters. Of course, it can be understood that when the number of inverters is odd, a detection effect can be also achieved by performing corresponding phase supplementation or correction calculation when the signal of the output end of the crack detection loop 105 is processed.

Therefore, in a possible implementation, the buffer circuit includes inverters, and the number of inverters is at least two.

Further, in a possible implementation, in order to prevent input ends of the inverters from being suspended and being interfered by an electromagnetic field in a surrounding environment, an input impedance of each inverter is increased, and an input end of the buffer circuit is also connected with a pull-down resistor.

Further, in order to make the pull-down resistor adapt to a variety of different types of dies, or different inverters, different input impedances are provided. The pull-down resistor can be set as a controllable pull-down resistor. A first end of the controllable pull-down resistor is connected to the input end of the buffer, and a second end of the controllable pull-down resistor is grounded.

A realizing form of the controllable pull-down resistor includes: using a switch tube to control whether a pure resistor is connected in series to the circuit to realize varying of a resistance of the controllable resistor.

FIG. 5 is a schematic structural diagram of a relay driving unit provided by the present disclosure. As illustrated in FIG. 5, a first end of a pull-down resistor 51 is connected to an input end of a buffer circuit, i.e., a buffer 52, and a second end of the pull-down resistor 51 is grounded. The pull-down resistor 51 includes a plurality of resistors: a resistor 511, a resistor 512, a resistor 513 and a resistor 514, and a switch tube connected in parallel to the resistors: a switch tube S1, a switch tube S2, a switch tube S3 and a switch tube S4.

It is to be noted that the switch tube may be a triode, an MOS transistor, or other switch elements.

The resistor 511, the resistor 512, the resistor 513 and the resistor 514 may be pure resistors, or may be equivalent resistors obtained in other ways.

In a possible implementation, the controllable pull-down resistor includes an MOS resistor. The MOS resistor is an MOS transistor in an on state; and a switch element, the switch element being connected between a source S and a drain D of the MOS transistor, and the switch element being used to control the MOS resistor to be short-circuited or not to change a resistance of the controllable pull-down resistor.

FIG. 6 is a schematic structural diagram of another relay driving unit provided by the present disclosure. As illustrated in FIG. 6, the buffer circuit includes a first inverter and a second inverter, and an on-resistance when MOS transistors Q1 to Q5 are turned on is used as another implementation of the resistors 511, 512, 513, and 514 illustrated in FIG. 5, that is, the MOS transistors are used to replace the resistors 511, 512, 513, and 514. It can be seen that the resistor 514 is formed by connecting two serially connected MOS transistors Q4 and Q5 in series, that is, each resistor may be obtained by connecting a plurality of MOS transistors in series or in parallel.

It is to be noted that at this time, a gate G of the MOS transistor needs to be connected to a turn-on potential. For example, an NMOS transistor needs to be connected to a high level, and a gate G of a PMOS transistor is connected to a low level, so that the MOS transistor forms a normally on state to obtain an MOS resistor.

The crack detection loop in FIG. 1 to FIG. 3 surrounds the internal integrated circuit of the die. Its specific shape can be the same as a shape of the seal ring, i.e., a polygonal shape. That is, projections of the crack detection loop and the seal ring on a substrate of the die are the same in shape.

In a possible design, corners of the crack detection loop are right angles, and corners of the seal ring are chamfered. The so-called chamfering may include: rounding and 45-degree chamfering (that is, an angle of 90 degrees is turned into two angles of 135 degrees). The corners of the crack detection loop are set to be right angles, so that when stress is received, damage is more likely to occur at a right angle due to stress concentration, thereby improving sensitivity of crack damage detection. The seal ring is to reduce the stress, so a chamfered structure is disposed.

The circuit for detecting crack damage of a die illustrated in FIG. 3 includes the first crack detection loop and the second crack detection loop. Detection signals of the two crack detection loops can be the same. At this time, the first output end and the second output end of the test circuit may be the same output end, so that the circuit structure can be simplified, and a detection calculation amount during control and reception of the pulse detection signal can be simplified at the same time.

The following describes how to use the circuit for detecting crack damage of a die provided in the present disclosure to execute a method for detecting crack.

FIG. 7 is a flowchart of a method for detecting crack provided by the present disclosure. As illustrated in FIG. 7, the method for detecting crack includes the following specific steps.

At S701, in response to a crack detection instruction, a pulse detection signal is input to a crack detection loop of a circuit for detecting crack damage of a die through a test circuit of the circuit for detecting crack damage of a die according to the crack detection instruction.

At this step, a user places a die on a detection platform through other machines, and the detection platform sends out a crack detection instruction to the die. Next, the test circuit of the circuit for detecting crack damage of a die sends out a pulse detection signal. The pulse detection signal enters the crack detection loop and is then amplified by a relay driving unit and driven to an output end of the crack detection loop.

At S702, whether a die to be tested is damaged by a crack is determined according to a signal output feature of an output pin of the die to be tested and the pulse detection signal.

At this step, the die to be tested includes the circuit for detecting crack damage of the die illustrated in FIG. 1 to FIG. 3.

The output pin of the die to be tested is connected to a test machine, and the test machine determines a crack damage by means of reading a signal of the output pin.

In a possible design, when the signal output feature and the pulse detection signal satisfy a preset corresponding condition, it is indicated that there is no crack damage in the die to be tested, when the signal output feature and the pulse detection signal do not satisfy a preset corresponding condition, it is indicated that there is crack damage in the die to be tested.

Specifically, there are several implementations for the preset corresponding condition. One implementation is that it is indicated that a signal can be turned on and there is no crack damage in the die to be tested as long as there is a signal output from the output pin, or it is indicated that the damage to the die to be tested is not severe enough to affect an internal circuit and the die can still be used as a normal die.

Another implementation of the preset corresponding condition is that the pulse detection signal and the output signal of the output pin are the same. Specifically, since the pulse signal is a periodic signal, it can be considered that there is no crack damage in the die to be tested if a period of the pulse signal detected at the output pin is the same as a period of an input signal.

A further implementation of the preset corresponding condition is that a pulse frequency of the pulse detection signal and a pulse frequency of the output signal of the output pin have a correspondence relation. Since the pulse signal may be subjected to other interference factors during receiving, individual pulses may not be detected. At this time, it is necessary to improve an error tolerance rate and change a detection frequency, i.e., the pulse frequency, of the received output signal. For example, the pulse detection signal originally sent at a frequency of 100 HZ is sampled at a frequency of 50 HZ during receiving, which can reduce misjudgment caused by interference of a single pulse or several pulses.

The present disclosure further provides a memory. The memory includes a memory chip for storing data.

The memory chip includes the circuit for detecting crack damage of the die in the above-mentioned embodiments.

In a possible design, the memory chip further includes a data input/output pin, and the data input/output pin is used to connect peripheral equipment.

When the memory is connected to a test machine through the data input/output pin, the memory enters a test mode, and the test machine determines, by means of detecting an output signal on the data input/output pin, whether the memory chip is damaged by a crack.

It is to be finally noted that the various above embodiments are only used to describe the technical solutions of the present disclosure, and not intended to limit the present disclosure. Although the present disclosure has been described in detail with reference to the foregoing embodiments, those ordinarily skilled in the art should understand that they can still modify the technical solutions described in all the foregoing embodiments, or equivalently replace some or all of the technical features, and these modifications or replacements do not depart the essences of the corresponding technical solutions from the spirit and scope of the technical solutions of all the embodiments of the present disclosure.

The invention claimed is:

1. A circuit for detecting crack damage of a die, comprising:
   a test circuit located within a seal ring of the die and used to output a pulse detection signal;
   a crack detection loop arranged outside a guard ring of an internal processing circuit of the die, an input end of the crack detection loop being connected to an output end of the test circuit and an output end of the crack detection loop being connected to an output pin of the die; and
   a relay driving unit arranged between the input end and output end of the crack detection loop and used to increase a capability of transmission of the pulse detection signal, wherein
   the seal ring surrounds the whole die and is used to protect the die;
   in a test mode, the test circuit outputs the pulse detection signal to the crack detection loop, and a test machine determines whether the die is damaged by a crack by reading a signal on the output pin of the die;
   the relay driving unit comprises:
      a buffer circuit which is used to enhance the pulse detection signal and drive the pulse detection signal to be transmitted to the output end of the crack detection loop; and a controllable pull-down resistor, a first end of the controllable pull-down resistor being connected to an input end of the buffer circuit, and a second end of the controllable pull-down resistor is grounded;

wherein the controllable pull-down resistor comprises:

a Metal Oxide Semiconductor (MOS) resistor, the MOS resistor being a MOS transistor in an on state; and a switch element, the switch element being connected between a source and a drain of the MOS transistor, and the switch element being used to control the MOS resistor to be short-circuited or not short-circuited to change a resistance of the controllable pull-down resistor.

2. The circuit for detecting crack damage of a die of claim 1, wherein the test circuit is located within the guard ring.

3. The circuit for detecting crack damage of a die of claim 1, wherein the crack detection loop comprises a first crack detection loop;

the first crack detection loop is arranged around the seal ring of the die; an input end of the first crack detection loop is connected to the output end of the test circuit and an output end of the first crack detection loop is connected to a first output pin of the die;

the output pin of the die comprises the first output pin.

4. The circuit for detecting crack damage of a die of claim 3, wherein the relay driving unit comprises a first relay driving unit;

the first relay driving unit is arranged between the input end and output end of the first crack detection loop and used to increase a capability of transmission of a first pulse detection signal in the first crack detection loop; and the pulse detection signal comprises the first pulse detection signal.

5. The circuit for detecting crack damage of a die of claim 1, wherein the crack detection loop comprises a second crack detection loop;

the second crack detection loop is arranged between the seal ring of the die and the guard ring in an encircling manner; an input end of the second crack detection loop is connected to a second output end of the test circuit and an output end of the second crack detection loop is connected to a second output pin of the die;

the output end of the test circuit comprises the second output end; and the output pin of the die comprises the second output pin.

6. The circuit for detecting crack damage of a die of claim 5, wherein the relay driving unit comprises a second relay driving unit;

the second relay driving unit is arranged between the input end and output end of the second crack detection loop and used to increase the capability of transmission of a second pulse detection signal in the second crack detection loop;

the pulse detection signal comprises the second pulse detection signal.

7. The circuit for detecting crack damage of a die of claim 1, wherein the crack detection loop comprises a first crack detection loop and second crack detection loop;

the first crack detection loop is arranged around the seal ring of the die; an input end of the first crack detection loop is connected to the output end of the test circuit and an output end of the first crack detection loop is connected to a first output pin of the die;

the second crack detection loop is arranged between the seal ring of the die and the guard ring in an encircling manner; an input end of the second crack detection loop is connected to a second output end of the test circuit and an output end of the second crack detection loop is connected to a second output pin of the die, the output end and the second output end are a same output end of the test circuit.

8. The circuit for detecting crack damage of a die of claim 1, wherein the crack detection loop is located on a top-layer metal layer of a substrate where the die to be tested is positioned.

9. The circuit for detecting crack damage of a die of claim 1, wherein the buffer circuit comprises an inverter, and the controllable pull-down resistor is used to prevent an input end of the inverter from being suspended.

10. The circuit for detecting crack damage of a die of claim 9, wherein the number of the inverter is at least two.

11. The circuit for detecting crack damage of a die of claim 1, wherein projections of the crack detection loop and the seal ring on a substrate of the die are the same in shape.

12. The circuit for detecting crack damage of a die of claim 1, wherein a corner of the crack detection loop is a right angle, and a corner of the seal ring is chamfered.

13. A method for detecting crack of a die, applied to a circuit for detecting crack damage of the die, the circuit comprising: a test circuit located within a seal ring of the die and used to output a pulse detection signal;

a crack detection loop arranged outside a guard ring of an internal processing circuit of the die, an input end of the crack detection loop being connected to an output end of the test circuit and an output end of the crack detection loop being connected to an output pin of the die; and a relay driving unit arranged between the input end and output end of the crack detection loop and used to increase a capability of transmission of the pulse detection signal, wherein the seal ring surrounds the whole die and is used to protect the die;

in a test mode, the test circuit outputs the pulse detection signal to the crack detection loop, and a test machine determines whether the die is damaged by a crack by reading a signal on the output pin of the die;

the relay driving unit comprises:

a buffer circuit which is used to enhance the pulse detection signal and drive the pulse detection signal to be transmitted to the output end of the crack detection loop; and a controllable pull-down resistor, a first end of the controllable pull-down resistor being connected to an input end of the buffer circuit, and a second end of the controllable pull-down resistor is grounded;

wherein the controllable pull-down resistor comprises:

a Metal Oxide Semiconductor (MOS) resistor, the MOS resistor being a MOS transistor in an on state; and a switch element, the switch element being connected between a source and a drain of the MOS transistor, and the switch element being used to control the MOS resistor to be short-circuited or not short-circuited to change a resistance of the controllable pull-down resistor, the method comprising:

in response to a crack detection instruction, inputting the pulse detection signal to the crack detection loop of the circuit for detecting crack damage of the die through the test circuit of the circuit for detecting crack damage of the die according to the crack detection instruction; and determining, according to a signal output feature of the output pin of the die to be tested and the pulse detection signal, whether there is crack damage in the die to be tested, the die to be tested including the circuit for detecting crack damage of the die.

14. The method for detecting crack of claim 13, wherein the determining, according to the signal output feature of the output pin of the die to be tested and the pulse detection signal, whether there is crack damage in the die to be tested comprises:

when the signal output feature and the pulse detection signal satisfy a preset corresponding condition, indicating that there is no crack damage in the die to be tested, when the signal output feature and the pulse detection signal do not satisfy the preset corresponding condition, indicating that there is crack damage in the die to be tested.

15. The method for detecting crack of claim 14, wherein the preset corresponding condition comprises that there is a signal output from the output pin.

16. The method for detecting crack of claim 15, wherein the preset corresponding condition comprises that the pulse detection signal and the signal output from the output pin are the same.

17. A memory, comprising:

a memory chip for storing data, wherein the memory chip comprises a circuit for detecting crack damage of a die, the circuit comprises:
- a test circuit located within a seal ring of the die and used to output a pulse detection signal;
- a crack detection loop arranged outside a guard ring of an internal processing circuit of the die, an input end of the crack detection loop being connected to an output end of the test circuit and an output end of the crack detection loop being connected to an output pin of the die; and
- a relay driving unit arranged between the input end and output end of the crack detection loop and used to increase a capability of transmission of the pulse detection signal, wherein the seal ring surrounds the whole die and is used to protect the die;

in a test mode, the test circuit outputs the pulse detection signal to the crack detection loop, and a test machine determines whether the die is damaged by a crack by reading a signal on the output pin of the die;

the relay driving unit comprises:
- a buffer circuit which is used to enhance the pulse detection signal and drive the pulse detection signal to be transmitted to the output end of the crack detection loop; and
- a controllable pull-down resistor, a first end of the controllable pull-down resistor being connected to an input end of the buffer circuit, and a second end of the controllable pull-down resistor is grounded;

wherein the controllable pull-down resistor comprises:
- a Metal Oxide Semiconductor (MOS) resistor, the MOS resistor being a MOS transistor in an on state; and
- a switch element, the switch element being connected between a source and a drain of the MOS transistor, and the switch element being used to control the MOS resistor to be short-circuited or not short-circuited to change a resistance of the controllable pull-down resistor;

the memory chip further comprises a data input/output pin, and the data input/output pin is used to connect peripheral equipment;

when the memory is connected to the test machine through the data input/output pin, the memory enters the test mode, and the test machine determines whether the memory chip is damaged by the crack, by detecting an output signal on the data input/output pin.

* * * * *